(12) United States Patent
Yang et al.

(10) Patent No.: US 11,233,039 B2
(45) Date of Patent: Jan. 25, 2022

(54) SEMICONDUCTOR PACKAGES

(71) Applicant: Taiwan Semiconductor Manufacturing Co., Ltd., Hsinchu (TW)

(72) Inventors: Sheng-Chieh Yang, Hsinchu (TW); Ching-Hua Hsieh, Hsinchu (TW); Chih-Wei Lin, Hsinchu County (TW); Yu-Hao Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 1 day.

(21) Appl. No.: 16/866,561

(22) Filed: May 5, 2020

(65) Prior Publication Data

US 2021/0066269 A1 Mar. 4, 2021

Related U.S. Application Data

(60) Provisional application No. 62/893,774, filed on Aug. 29, 2019.

(51) Int. Cl.
*H01L 25/16* (2006.01)
*H01L 23/498* (2006.01)

(52) U.S. Cl.
CPC ...... *H01L 25/167* (2013.01); *H01L 23/49822* (2013.01)

(58) Field of Classification Search
CPC ... H01L 25/167; H01L 23/49822; G02B 6/00; G02B 6/122
See application file for complete search history.

(56) References Cited

U.S. PATENT DOCUMENTS

| | | | |
|---|---|---|---|
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 10,989,887 B2* | 4/2021 | Lim | H01L 24/16 |
| 2018/0045891 A1* | 2/2018 | Israel | G02B 6/3692 |
| 2018/0180808 A1* | 6/2018 | Zhang | H05K 1/115 |
| 2019/0033542 A1* | 1/2019 | Epitaux | G02B 6/4246 |
| 2019/0162901 A1* | 5/2019 | Yu | H01L 21/6835 |
| 2020/0286871 A1* | 9/2020 | Liff | H01L 24/73 |
| 2020/0310052 A1* | 10/2020 | Lim | G02B 6/4255 |

* cited by examiner

*Primary Examiner* — Nicholas J Tobergte
(74) *Attorney, Agent, or Firm* — JCIPRNET

(57) ABSTRACT

Semiconductor packages are provided. The semiconductor package includes a first redistribution layer structure, a photonic integrated circuit, an electronic integrated circuit, a waveguide and a memory. The photonic integrated circuit is disposed over and electrically connected to the first redistribution layer structure, and includes an optical transceiver and an optical coupler. The electronic integrated circuit is disposed over and electrically connected to the first redistribution layer structure. The waveguide is optically coupled to the optical coupler. The memory is electrically connected to the electronic integrated circuit.

20 Claims, 15 Drawing Sheets

SEMICONDUCTOR PACKAGES

CROSS-REFERENCE TO RELATED APPLICATION

This application claims the priority benefit of U.S. provisional application Ser. No. 62/893,774, filed on Aug. 29, 2019. The entirety of the above-mentioned patent application is hereby incorporated by reference herein and made a part of this specification.

BACKGROUND

Optical signals are usable for high speed and secure data transmission between two devices. In some applications, a device capable of optical data transmission includes at least an integrated circuit (IC or "chip") having a laser die for transmitting and/or receiving optical signals. Also, the device usually has one or more other optical or electrical components, a waveguide for the transmission of the optical signals, and a support, such as a substrate of a printed circuit board, on which the chip equipped with the laser die and the one or more other components are mounted. Various approaches for mounting a chip equipped with a laser die on a substrate have been studied.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
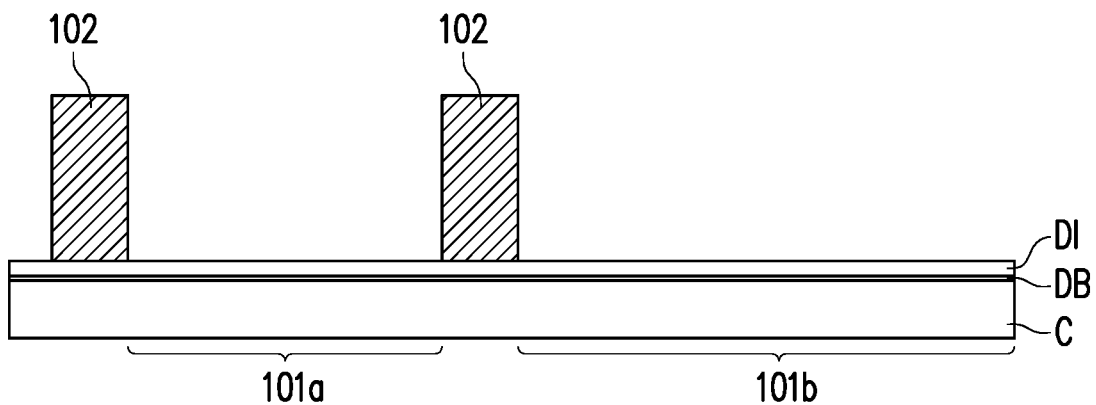
FIG. 1A to FIG. 1E are schematic cross-sectional views of a method of forming a semiconductor package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution circuit structure or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1E are schematic cross-sectional views of a method of forming a semiconductor package in accordance with some embodiments.

Referring to FIG. 1A, a carrier C with a de-bonding layer DB coated thereon is provided. In some embodiments, the carrier C may be a glass carrier, a ceramic carrier, a metal carrier or any other carrier suitable for carrying a semiconductor wafer or a reconstituted wafer for the manufacturing method of the semiconductor package. In some embodiments, the de-bonding layer DB may be any other material suitable for bonding and debonding the carrier C from the above layers or wafer disposed thereon. The de-bonding layer DB includes, for example, a light-to-heat conversion ("LTHC") layer, and such layer enables debonding from the carrier by applying laser irradiation. In some alternative embodiments, a buffer layer may be formed between the de-bonding layer DB and the carrier C. In some embodiments, a dielectric layer DI is formed over the de-bonding layer DB. In some embodiments, the dielectric layer DI is, for example, polymer such as polyimide, benzocyclobutene ("BCB"), polybenzoxazole ("PBO"), or the like. In some alternative embodiments, the dielectric layer DI may include non-organic dielectric materials such as silicon oxide, silicon nitride, silicon carbide, silicon oxynitride, or the like. However, the materials of the carrier C, the de-bonding layer DB and the dielectric layer DI are merely for illustration, and the disclosure is not limited thereto.

Then, a plurality of conductive posts 102 are provided over the dielectric layer DI. The conductive posts 102 may be copper pillars. In some embodiments, the conductive posts 102 are separated from each other, to define a first region 101a for an electrical integrated circuit and a second region 101b for a photonic integrated circuit. That is, the electrical integrated circuit and the photonic integrated circuit will be then disposed in the first region 101a and the second region 101b respectively. However, the disclosure is not limited thereto.

Figure 1B:
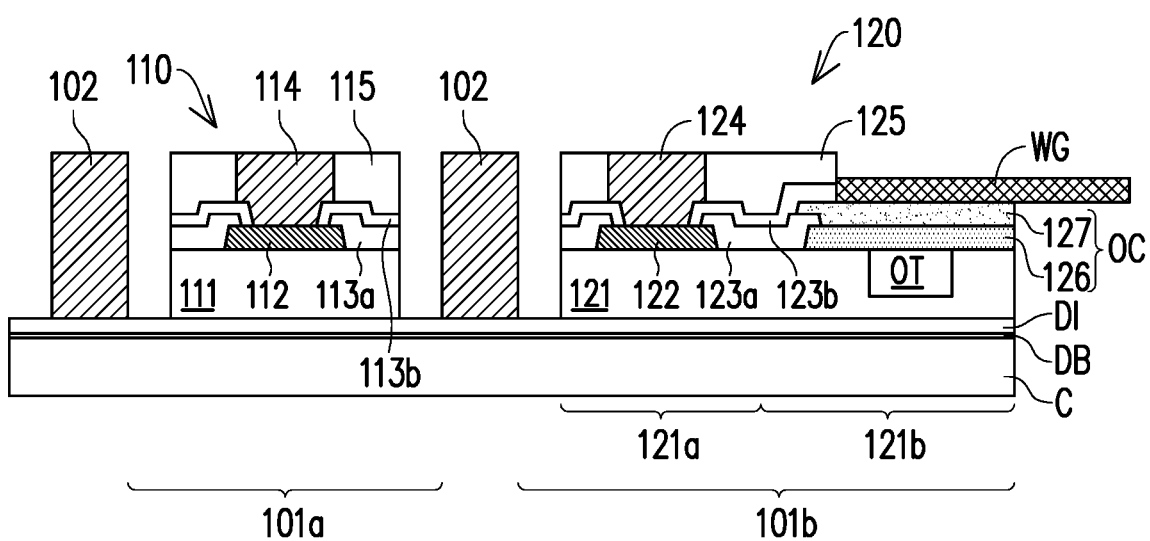

Referring to FIG. 1B, an electrical integrated circuit 110 and a photonic integrated circuit 120 are disposed between the conductive posts 102 over the dielectric layer DI. For example, the electrical integrated circuit 110 is picked and placed onto the dielectric layer DI in the first region 101a, and the photonic integrated circuit 120 is picked and placed onto the dielectric layer DI in the second region 101b. In some embodiments, a die attach film is located between the electrical integrated circuit 110 and the dielectric layer DI for adhering the electrical integrated circuit 110 onto the dielectric layer DI. Similarly, a die attach film is located between the photonic integrated circuit 120 and the dielectric layer DI for adhering the photonic integrated circuit 120 onto the dielectric layer DI.

In some embodiments, the electrical integrated circuit 110 includes a substrate 111, a conductive pad 112, passivation layers 113a, 113b, a conductive post 114 and a protection layer 115. The substrate 111 includes an elementary semiconductor such as silicon or germanium and/or a compound semiconductor such as silicon germanium, silicon carbide, gallium arsenic, indium arsenide, gallium nitride or indium phosphide. In some embodiments, the substrate 111 is a semiconductor-on-insulator (SOI) substrate. In some alternative embodiments, the substrate 111 may take the form of a planar substrate, a substrate with multiple fins, nanowires or any other form known to people having ordinary skill in the art. Depending on the requirements of design, the substrate 111 may be a P-type substrate or an N-type substrate and may have doped regions therein. The doped regions may be configured for an N-type device or a P-type device.

The electrical integrated circuit 110 may include a device layer formed in or on the substrate 111. In some embodiments, the device layer may include transistors, resistors, capacitors, inductors, and/or the like. The conductive pad 112 may be formed on and electrically connected to the device layer and may be a pad of an interconnect structure. The conductive pad 112 is an aluminum contact pad, for example. The passivation layers 113a, 113b may be sequentially formed on the substrate 111 and expose a portion of the conductive pad 112. In some embodiments, a material of the passivation layer 113a is different form a material of the passivation layer 113b. A material of the passivation layer 113a, 113b may include silicon oxide, silicon oxynitride, silicon nitride, BCB, PBO, polyimide or a combination thereof. The conductive post 114 is disposed on and electrically connected to the conductive pad 112. The conductive post 114 is a copper pillar or copper alloy pillar, for example. The protection layer 115 covers the conductive post 114 and the passivation layers 113a, 113b. In some alternative embodiments, before placing the electrical integrated circuit 110 over the carrier C, the conductive post 114 is uncovered (i.e., bare dies not molded or encapsulated). A material of the protection layer 115 may include silicon oxide, silicon nitride, silicon oxynitride, a low-k material, a photo-sensitive material such as a siloxane based inorganic-organic hybrid material, polyimide, a combination thereof, or the like.

In some embodiments, the photonic integrated circuit 120 includes a substrate 121, the optical coupler OC and an optical transceiver OT. The substrate 121 may be divided into two regions: an electro-interconnection region 121a and an optical region 121b. The substrate 121 includes silicon, silicon oxide, aluminum oxide, sapphire, germanium, silicon germanium, gallium arsenic, gallium nitride, indium arsenide, indium phosphide or any other suitable material. In some embodiments, the substrate 121 may include an epitaxial layer. For example, the substrate 121 has an epitaxial layer overlying a bulk semiconductor. Further, the substrate 121 may be strained for performance enhancement. The epitaxial layer may include a semiconductor material different from those of the bulk semiconductor such as a layer of silicon germanium overlying bulk silicon or a layer of silicon overlying a bulk silicon germanium formed by a process including selective epitaxial growth (SEG). Furthermore, the substrate 121 may include a semiconductor-on-insulator (SOI) structure such as a buried dielectric layer. In one embodiment, the substrate 121 includes silicon with (100) crystal orientation. The electro-connection region 121a includes a plurality of patterned dielectric layers and patterned conductive layers that provide interconnections (e.g., wiring) between the various components, circuitry, and input/output of an IC device. For example, the electro-interconnection region 121a includes a conductive pad 122 on the substrate 121, passivation layers 123a, 123b partially covering the substrate 121, a conductive post 124 and a protection layer 125. The conductive pad 122, the passivation layers 123a, 123b, the conductive post 124 and the protection layer 125 may be similar to the conductive pad 112, the passivation layers 113a, 113b, the conductive post 114 and the protection layer 115 respectively. In some embodiments, the optical transceiver OT is disposed in the optical region 121b. The optical transceiver OT is embedded in the substrate 121, for example. The optical transceiver OT includes an optical receiver such as a photodiode and an optical transmitter such as a laser diode.

Figure 2:
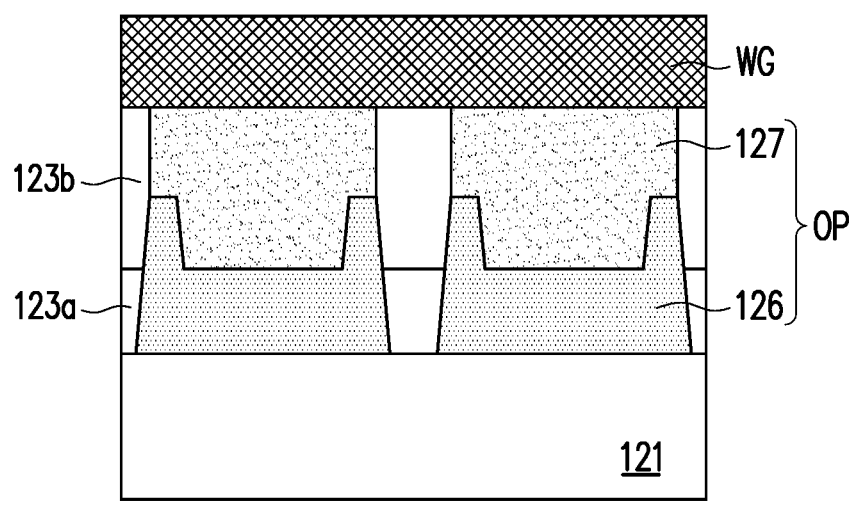
FIG. 2 is another cross-sectional view an optical coupler of FIG. 1B.

FIG. 1B is a schematic cross-sectional view along a first line, and FIG. 2 is another cross-sectional view along a second line which is substantially perpendicular to the first line. Referring to FIGS. 1B and 2, in some embodiments, the optical coupler OC is disposed in the optical region 121b. In some embodiments, the optical coupler OC includes a plurality of waveguides 126, 127. The waveguide 126 may be a silicon waveguide, and the waveguide 127 may be a polymer waveguide. The waveguide 126 is formed over the substrate 121. In some embodiments, a material of the waveguide 126 is silicon, silicon oxynitride, polyimide or any other suitable material. A material of the waveguide 127 is different from the material of the waveguide 126, and a material of the waveguide 127 is a polymer material such as a photo-sensitive polymer. The photo-sensitive polymer may be a negative photo-sensitive polymer or a positive photo-sensitive polymer. In some embodiments, the waveguide 126 is disposed adjacent to an edge of the substrate 121, for example. The waveguide 127 is disposed on the waveguide 126 and the passivation layer 123a, for example. As shown in FIG. 2, in some embodiments, the waveguide 127 is partially disposed in the waveguide 126 and partially covered by the passivation layer 123b, for example. In some embodiments, the waveguide 127 may be also referred to as a core layer.

Then, a waveguide WG is formed over the photonic integrated circuit 120 to optically couple with the optical coupler OC. In some embodiments, the waveguide WG is formed at an edge of the photonic integrated circuit 120. The waveguide WG is disposed on and in direct and physical contact with the waveguide 127, for example. In some embodiments, the waveguide WG is an optical fiber. In some embodiments, the waveguide WG is extended beyond the optical coupler OC and protruded from the edge of the photonic integrated circuit 120. In some embodiments, edges of the waveguide 126, the waveguide 127 and the substrate 121 are substantially aligned with one another, and the waveguide WG is extended beyond the edges of the waveguide 126, the waveguide 127 and the substrate 121. In some embodiments, the protection layer 125 may be also referred to as a cladding layer. In some embodiments, the waveguide WG is entirely exposed. In some embodiments, an outer sidewall of the protection layer 125 is substantially perpendicular to a surface of the substrate 121. However, the disclosure is not limited thereto. In some alternative embodiments, the outer sidewall of the protection layer 125 is inclined with respect to a surface of the substrate 121.

Figure 1C:
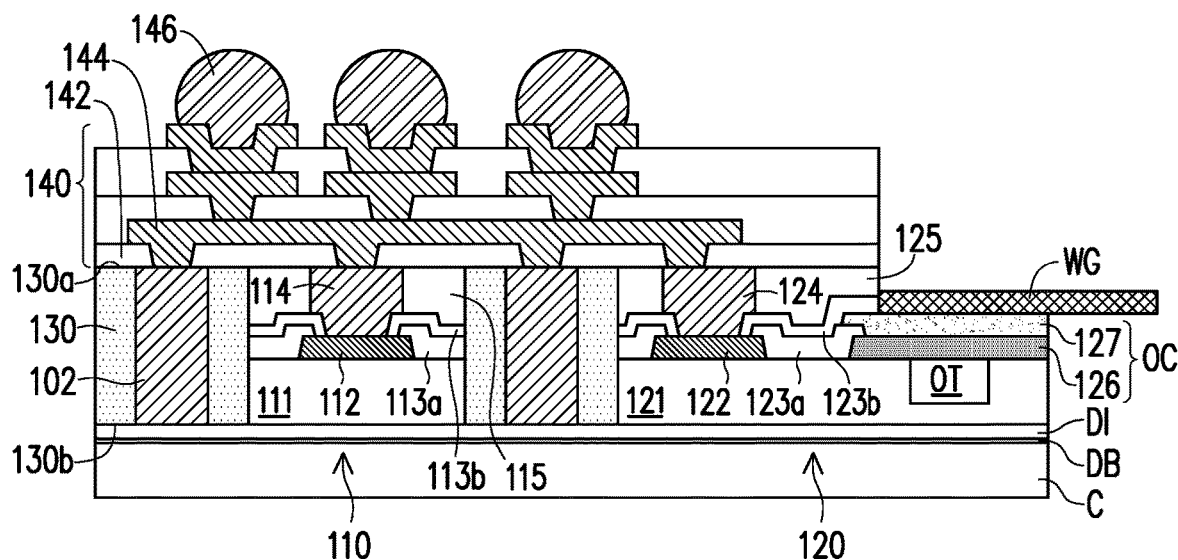

Referring to FIG. 1C, an encapsulant 130 is formed over the carrier C to encapsulate the electrical integrated circuit 110, the photonic integrated circuit 120 and the conductive posts 102. In some embodiments, the encapsulant 130 fills between or surrounds the electrical integrated circuit 110, the photonic integrated circuit 120 and the conductive posts 102. In some embodiments, a first surface 130a (i.e., top surface) of the encapsulant 130 is substantially coplanar with top surfaces of the electrical integrated circuit 110, the photonic integrated circuit 120 and the conductive posts 102. In some embodiments, the first surface 130a of the encapsulant 130 is substantially flush with top surfaces of the conductive post 114 and the protection layer 115 of the electrical integrated circuit 110, the conductive post 124 and the protection layer 125 of the photonic integrated circuit 120 and the conductive posts 102. The encapsulant 130 is formed by a molding process and a planarization process, for example. In some embodiments, as shown in FIG. 1B, the top surfaces of the electrical integrated circuit 110, the photonic integrated circuit 120 and the conductive posts 102 are illustrated as being substantially coplanar with each other before forming the encapsulant 130. However, the disclosure is not limited thereto. In some alternative embodiments, the top surfaces of the electrical integrated circuit 110, the photonic integrated circuit 120 and the conductive posts 102 may be not flush with each other before performing the planarization process. That is, the planarization process may remove portions of the conductive post 114, the protection layer 115, the conductive post 124, the protection layer 125 and/or the conductive posts 102.

Then, a redistribution layer structure 140 is formed over the first surface 130a of the encapsulant 130 to electrically connect to the electrical integrated circuit 110, the photonic integrated circuit 120 and the conductive posts 102. As shown in FIG. 1C, the waveguide WG is exposed without being covered by the redistribution layer structure 140. In some embodiments, the redistribution layer structure 140 includes a plurality of dielectric layers 142 and a plurality of conductive patterns 144 in the dielectric layers 142. The conductive patterns 144 are electrically connected to each other. The conductive patterns 144 includes conductive lines, conductive vias or the like. In some embodiments, a material of the conductive patterns 144 includes aluminum, titanium, copper, nickel, tungsten, silver and/or alloys thereof. In some embodiments, a material of the dielectric layers 142 includes silicon oxide, silicon oxynitride, silicon nitride, BCB, PBO, polyimide or a combination thereof. In some embodiments, the bottommost conductive patterns 144 of the redistribution layer structure 140 are electrically connected to the conductive post 114 of the electrical integrated circuit 110, the conductive post 124 of the photonic integrated circuit 120 and the conductive posts 102 respectively. However, the disclosure is not limited thereto.

After that, a plurality of conductive terminals 146 are formed over and electrically connected to the redistribution layer structure 140. In some embodiments, the conductive terminals 146 are electrically connected to the electrical integrated circuit 110, the photonic integrated circuit 120 and the conductive posts 102 through the redistribution layer structure 140. In some embodiments, the conductive terminals 146 are, for example, solder balls or ball grid array ("BGA") balls. In some embodiments, the conductive terminals 146 may be placed on the conductive patterns 144 (e.g., under-ball metallurgy patterns) through a ball placement process or any other suitable process.

Figure 1D:
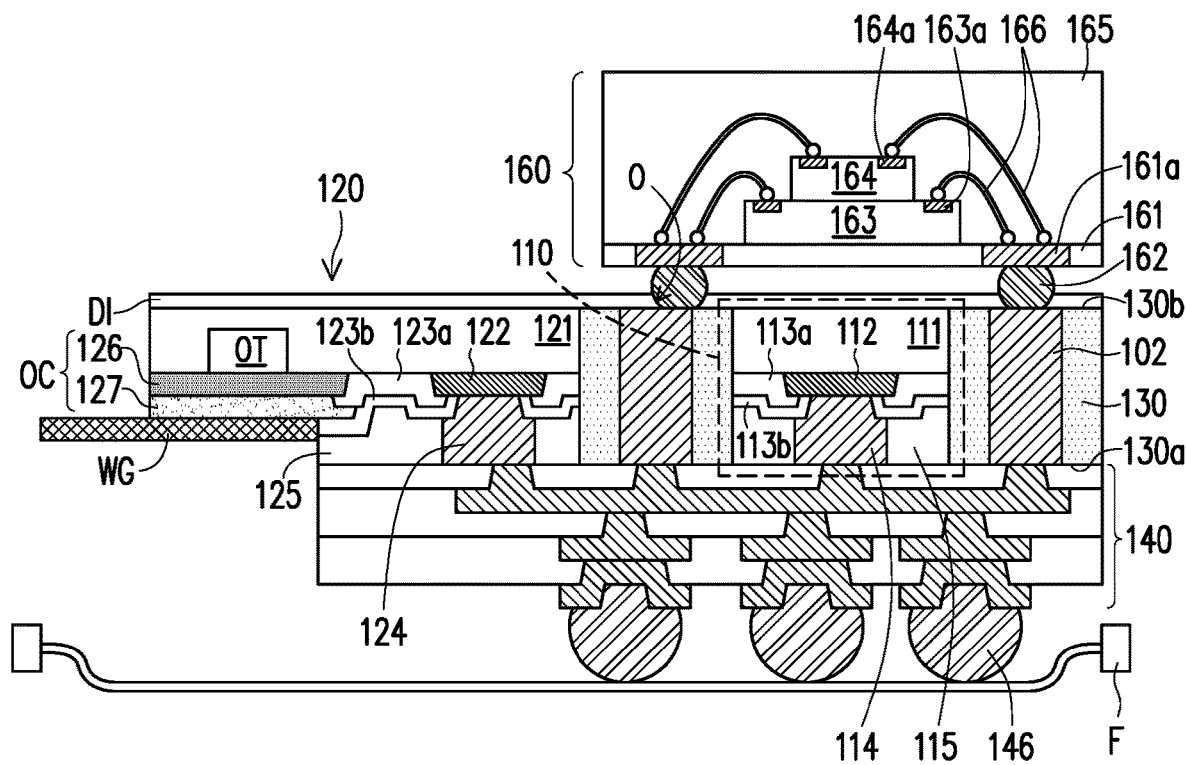

Referring to FIG. 1D, the dielectric layer DI is de-bonded from the de-bonding layer DB such that the structure of FIG. 1C is separated from the carrier C. That is, the carrier C is removed. In some embodiments, the de-bonding layer DB (e.g., the LTHC release layer) may be irradiated by an UV laser such that the dielectric layer DI adhered on a second surface 130b (i.e., bottom surface) of the encapsulant 130 is peeled from the carrier C. Then, the formed structure is turned upside down and disposed on a frame F. As illustrated in FIG. 1D, the dielectric layer DI is then patterned such that a plurality of contact openings O are formed to partially expose the conductive posts 102. The number of the contact openings O corresponds to the number of the conductive posts 102. In some embodiments, the contact openings O of the dielectric layer DI are formed by a laser drilling process, a mechanical drilling process or any other suitable process.

Then, a memory 160 is disposed on and electrically connected to the conductive posts 102. In some embodiments, the memory 160 is disposed over the second surface 130b of the encapsulant 130. In some embodiments, the memory 160 is electrically connected to the conductive posts 102 through a plurality of conductive terminals 162 such as micro-bumps therebeneath. In some embodiments, the memory 160 includes a substrate 161, a first die 163 on the substrate 161, a second die 164 stacked on the first die 163 and an encapsulant 165 encapsulating the first die 163 and the second die 164. The substrate 161, the first die 163 and the second die 164 respectively have a plurality of conductive pads 161a, 163a, 164a, for example. The conductive terminals 162 are electrically connected to the conductive pads 161a. In some embodiments, the memory 160 further includes a plurality of conductive wires 166 encapsulated by the encapsulant 165. The conductive wires 166 are formed between the conductive pads 161a of the substrate 161 and the conductive pads 163a of the first die 163, to electrically connect the substrate 161 and the first die 163. Similarly, the conductive wires 166 are formed between the conductive pads 161a of the substrate 161 and the conductive pads 164a of the second die 164, to electrically connect the substrate 161 and the second die 164.

Figure 1E:
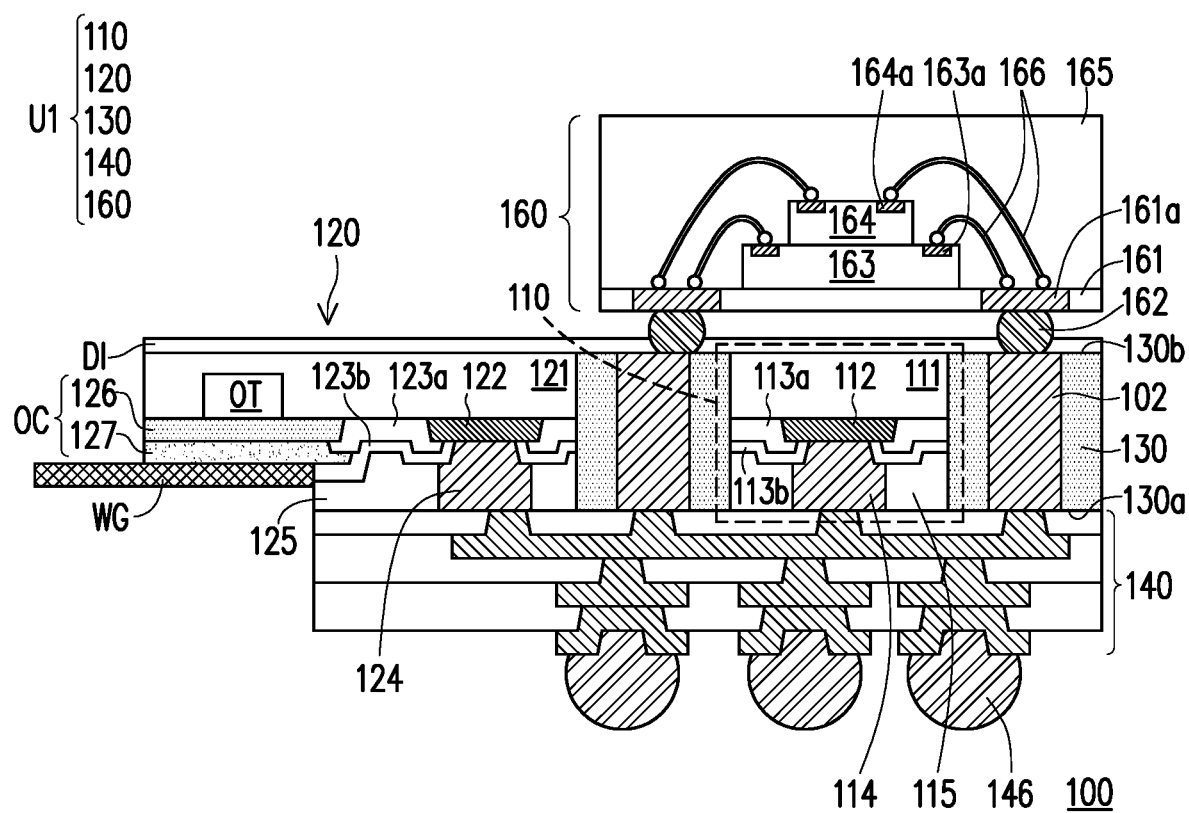
Figure 3:
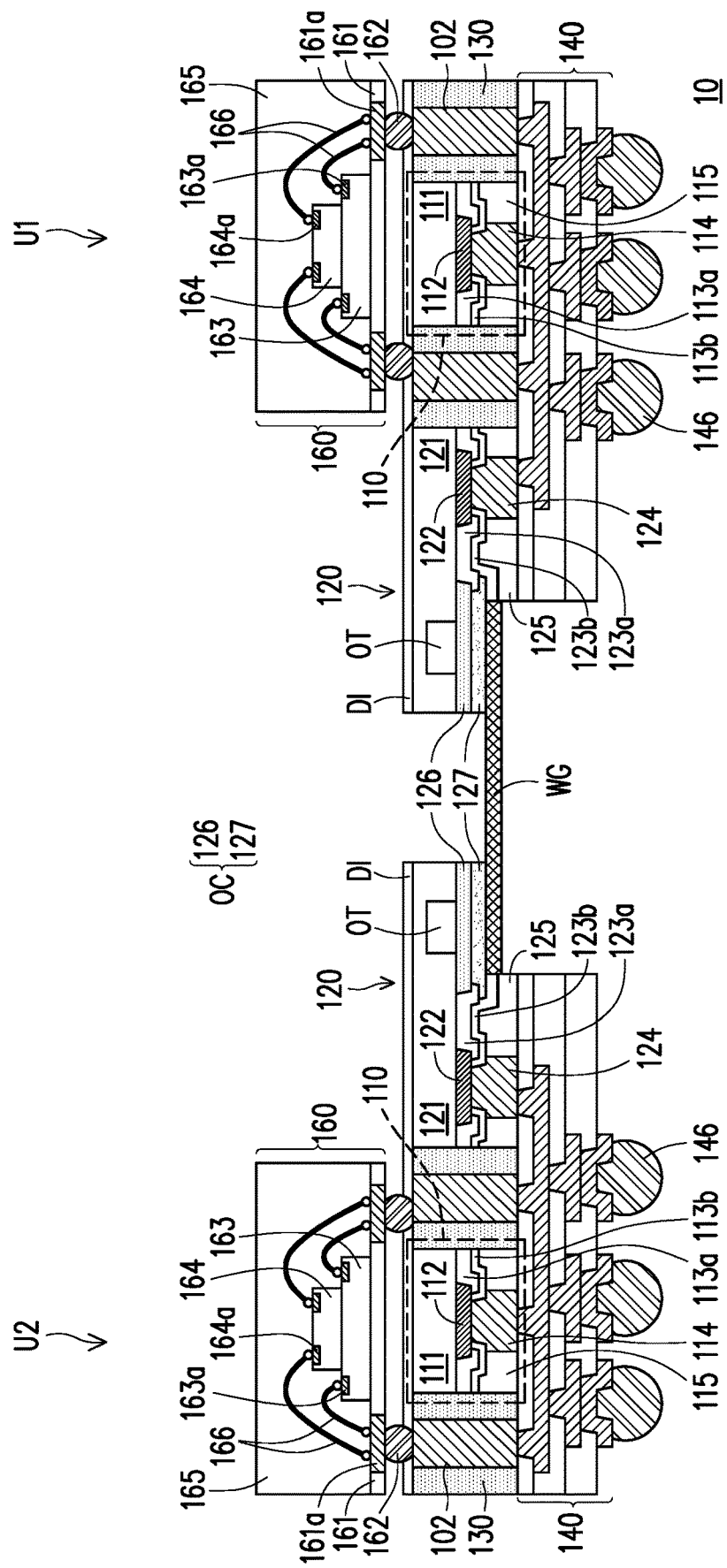
FIG. 3 is a schematic cross-sectional view of a semiconductor package in accordance with some embodiments.

Referring to FIG. 1E, the structure in FIG. 1D is de-bonded from the frame F, and a semiconductor package 100 is formed. In some embodiments, the semiconductor package 100 includes a unit U1 and the waveguide WG optically coupled to the unit U1. In some embodiments, the unit U1 includes the electrical integrated circuit 110, the photonic integrated circuit 120 and the memory 160. In some embodiments, as shown in FIG. 3, the unit U1 of the FIG. 1E may be connected to another unit U2 by the waveguide WG therebetween, so as to form a semiconductor package 10. In some embodiments, the unit U2 has a configuration similar to the unit U1. However, the disclosure is not limited thereto. In some alternative embodiments, the units U1, U2 may have different configuration.

Figure 4A:
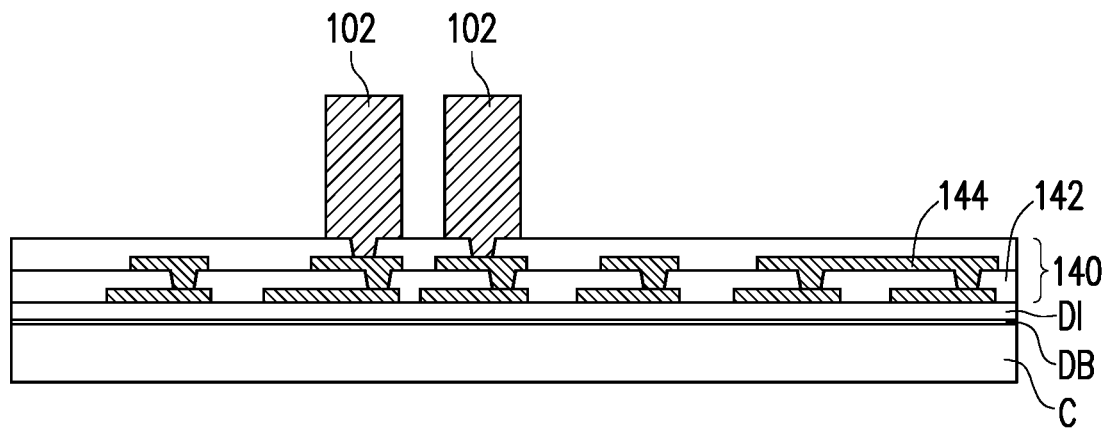
FIG. 4A to FIG. 4F are schematic cross-sectional views of a method of forming a semiconductor package in accordance with some embodiments.

FIG. 4A to FIG. 4F are schematic cross-sectional views of a method of forming a semiconductor package in accordance with some embodiments. Referring to FIG. 4A, a redistribution layer structure 140 is formed over a carrier C, and a plurality of conductive posts 102 are formed on the redistribution layer structure 140. In some embodiments, a debonding layer DB and a dielectric layer DI are sequentially formed on the carrier C, and the redistribution layer structure 140 is formed on the dielectric layer DI. In some embodiments, the redistribution layer structure 140 is a back-side redistribution layer structure. The redistribution layer structure 140 includes a plurality of dielectric layers 142 and a plurality of conductive patterns 144 in the dielectric layers 142. The conductive patterns 144 are electrically connected to each other. The conductive posts 102 are electrically connected to the uppermost conductive patterns 144 of the redistribution layer structure 140. In some embodiments, two conductive posts 102 are disposed immediately adjacent to each other, to define a first region 101a for an electrical integrated circuit and a second region 101b for a photonic integrated circuit. That is, the electrical integrated circuit and the photonic integrated circuit will be then disposed in the first region 101a and the second region 101b respectively. However, the disclosure is not limited thereto. In some alternative embodiments, one conductive post or more than two conductive posts may be disposed to separate the first region 101a and the second region 101b. Materials and/or forming methods of the carrier C, the conductive posts 102 and the redistribution layer structure 140 may be similar to or substantially the same as those of the carrier C, the conductive posts 102 and the redistribution layer structure 140 described above, and thus details are omitted herein.

Figure 4B:
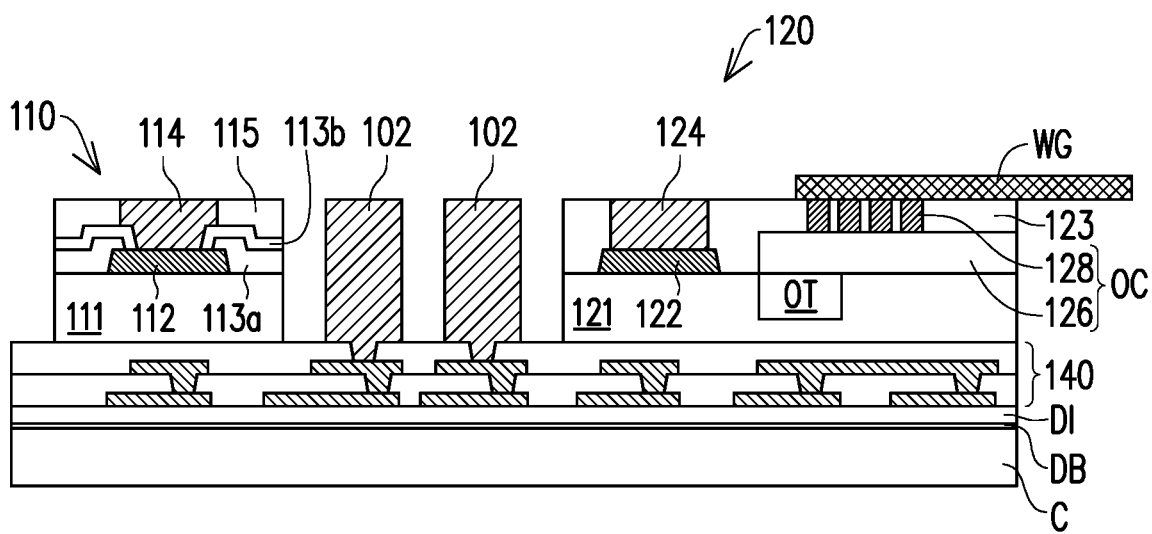

Referring to FIG. 4B, then, an electrical integrated circuit 110 and a photonic integrated circuit 120 are disposed on the redistribution layer structure 140. For example, the electrical integrated circuit 110 is picked and placed onto the dielectric layer DI in the first region 101a, and the photonic integrated circuit 120 is picked and placed onto the dielectric layer DI in the second region 101b. In some embodiments, the photonic integrated circuit 120 includes a substrate 121 including an electro-interconnection region 121a and an optical region 121b, a conductive pad 122 and a conductive post 124 in the electro-interconnection region 121a and an optical transceiver OT and an optical coupler OC in the optical region 121b. In some embodiments, the photonic integrated circuit 120 further includes a passivation layer 123 is disposed on the substrate 121, and the conductive pad 122, the conductive post 124 and the optical coupler OC are disposed in the passivation layer 123. The passivation layer 123 may be a single layered or multiple layered structure. In some embodiments, the electrical integrated circuit 110 and the photonic integrated circuit 120 may be similar to the electrical integrated circuit 110 and the photonic integrated circuit 120 of FIG. 1E, and the main difference is described below.

Figure 5:
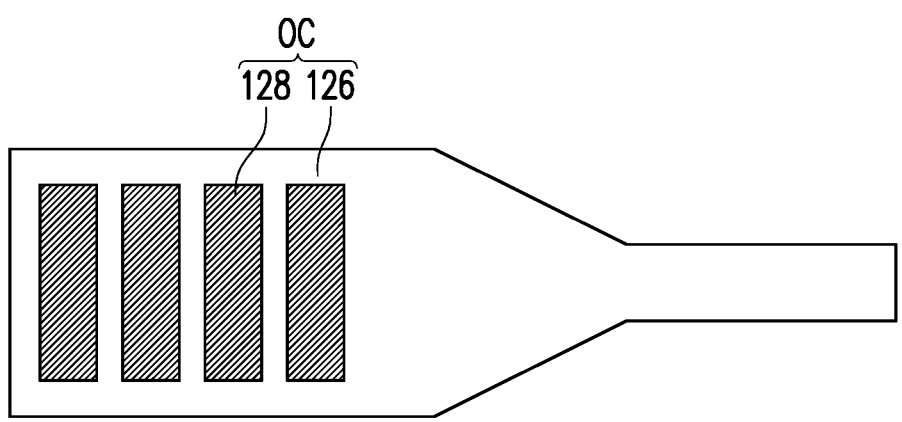
FIG. 5 is a top view of an optical coupler of FIG. 4B.

FIG. 5 is a top view of an optical coupler of FIG. 4B. Referring to FIGS. 4B and 5, the optical coupler OC includes a waveguide 126 and a grating 128, for example. In some embodiments, the waveguide 126 may be a silicon waveguide, and the grating 128 may be a metal grating. A material of the waveguide 126 may be silicon nitride. The grating 128 may be formed directly on the waveguide 126 or have some spacing therebetween. In some embodiments, the grating 128 changes the direction of an incident optical signal light, and the waveguide 126 guides the optical signal light towards the optical transceiver OT. The electrical signal generated by the optical transceiver OT from the optical signal can be sent through the electro-connection region 121a interconnected to a desired part of the photonic integrated circuit 120. A material of the grating 128 may be copper, aluminum or any other suitable material. In some embodiments, as shown in FIG. 5, the waveguide 126 and the grating 128 have a triangular shape for coupling the optical signal on the wide right side that narrows towards the left side. In some alternative embodiments, the waveguide 126 and the grating 128 may have any other suitable shape.

Then, a waveguide WG is formed over the photonic integrated circuit 120 to optically couple with the optical coupler OC. In some embodiments, the waveguide WG is formed at an edge of the photonic integrated circuit 120. The waveguide WG is disposed on and in direct and physical contact with the grating 128, for example. In some embodiments, the waveguide WG is an optical fiber. In some embodiments, the waveguide WG is extended beyond the optical coupler OC and protruded from the edge of the photonic integrated circuit 120. For example, the waveguide WG is extended beyond the edges of the passivation layer 123 and the substrate 121.

Figure 4C:
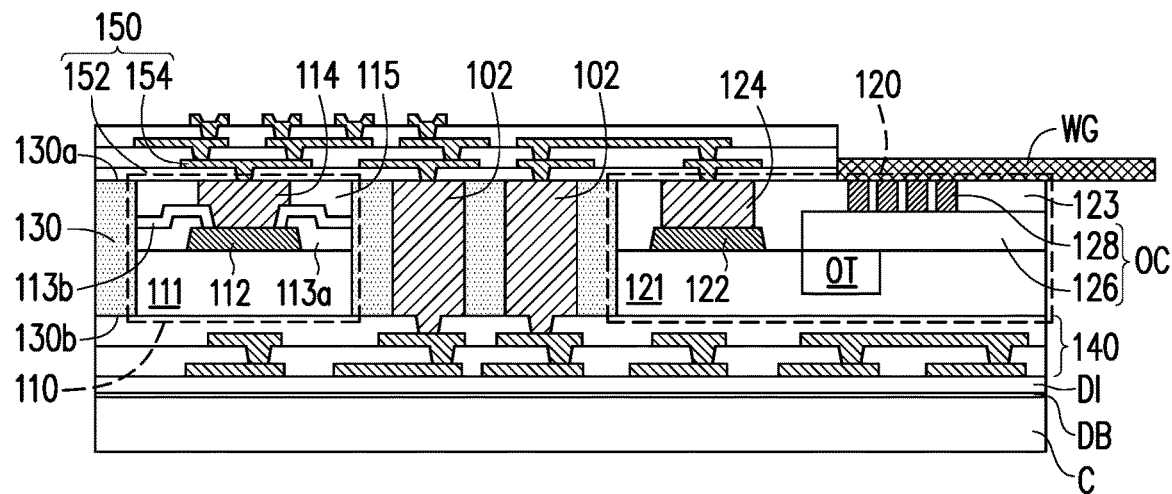

Referring to FIG. 4C, an encapsulant 130 is formed over the carrier C to encapsulate the electrical integrated circuit 110, the photonic integrated circuit 120 and the conductive posts 102. In some embodiments, the encapsulant 130 fills between or surrounds the electrical integrated circuit 110, the photonic integrated circuit 120 and the conductive posts 102. A first surface 130a (i.e., top surface) of the encapsulant 130 is substantially coplanar with top surfaces of the electrical integrated circuit 110, the photonic integrated circuit 120 and the conductive posts 102. In some embodiments, the first surface 130a of the encapsulant 130 is substantially flush with top surfaces of the conductive post 114 and the protection layer 115 of the electrical integrated circuit 110, the conductive post 124, the protection layer 125 and the grating 128 of the photonic integrated circuit 120 and the conductive posts 102.

Then, a redistribution layer structure 150 is formed over the first surface 130a of the encapsulant 130 to electrically connect to the electrical integrated circuit 110, the photonic integrated circuit 120 and the conductive posts 102. In some embodiments, the redistribution layer structure 150 is separated from the waveguide WG. That is, a horizontal distance is formed between the redistribution layer structure 150 and the waveguide WG. In some embodiments, the redistribution layer structure 150 includes a plurality of dielectric layers 152 and a plurality of conductive patterns 154 in the dielectric layers 152. The conductive patterns 154 are electrically connected to each other. The conductive patterns 154 includes conductive lines, conductive vias or the like. In some embodiments, a material of the conductive patterns 154 includes aluminum, titanium, copper, nickel, tungsten, silver and/or alloys thereof. In some embodiments, a material of the dielectric layer 152 includes silicon oxide, silicon oxynitride, silicon nitride, BCB, PBO, polyimide or a combination thereof. In some embodiments, the bottommost conductive patterns 154 of the redistribution layer structure 150 are electrically connected to the conductive post 114 of the electrical integrated circuit 110, the conductive post 124 of the photonic integrated circuit 120 and the conductive posts 102 respectively. However, the disclosure is not limited thereto. In some embodiments, an outer sidewall of the redistribution layer structure 150 is substantially flush with a sidewall of the encapsulant 130. However, the disclosure is not limited thereto.

Figure 4D:
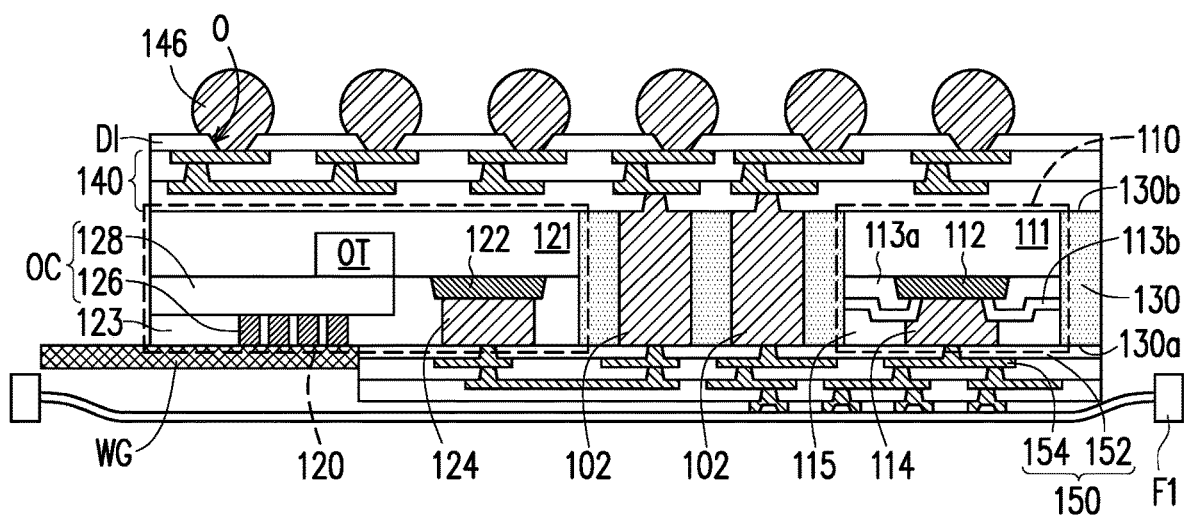

Referring to FIG. 4D, the dielectric layer DI is de-bonded from the de-bonding layer DB such that the structure of FIG. 4C is separated from the carrier C. That is, the carrier C is removed. Then, the formed structure is turned upside down and disposed on a frame F1. In some embodiments, the de-bonding layer DB (e.g., the LTHC release layer) may be irradiated by an UV laser such that the dielectric layer DI adhered on a second surface 130b (i.e., bottom surface) of the encapsulant 130 is peeled from the carrier C. After that, the dielectric layer DI is then patterned such that a plurality of contact openings O are formed to partially expose some of the conductive patterns 144. Then, a plurality of conductive terminals 146 are formed over and electrically connected to the redistribution layer structure 140. In some embodiments, the conductive terminals 146 are electrically connected to the electrical integrated circuit 110, the photonic integrated circuit 120 and the conductive posts 102 through the redistribution layer structure 140. In some embodiments, the conductive terminals 146 are, for example, solder balls or ball grid array ("BGA") balls.

Figure 4E:
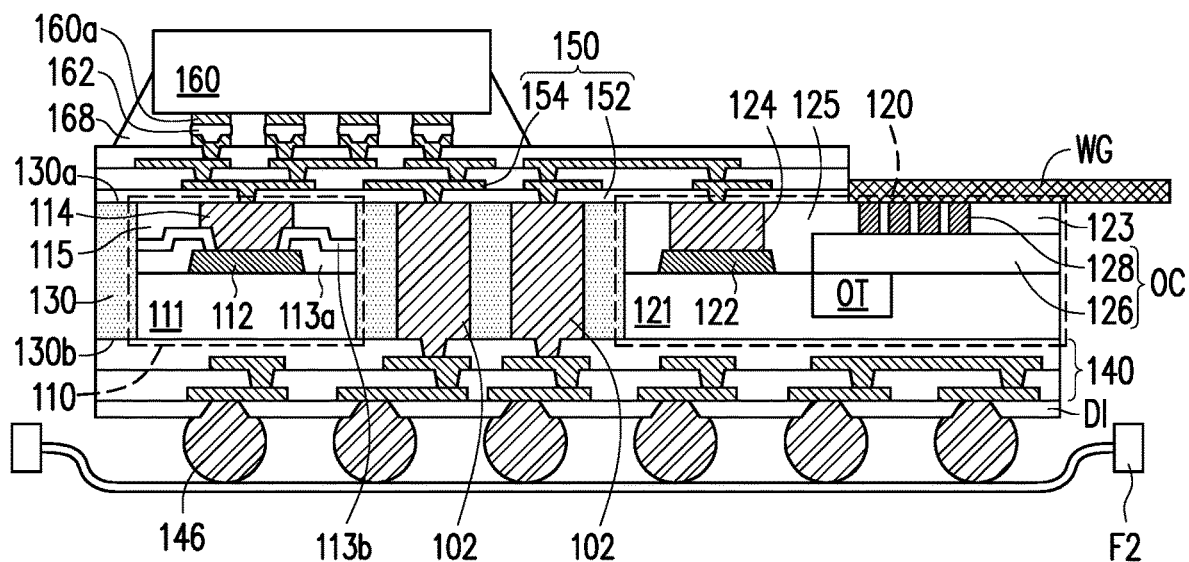

Referring to FIG. 4E, the structure of FIG. 4D is de-bonded from the frame F1, and is turned upside down and disposed on a frame F2. Then, a memory 160 is disposed on and electrically connected to the redistribution layer structure 150. In some embodiments, the memory 160 is joined onto the redistribution layer structure 150 through a plurality of conductive terminals 162 and an underfill 168. The conductive terminals 162 are disposed on a surface of the memory 160 and electrically connected to a plurality of conductive pads 160a of the memory 160. After bonding, the conductive terminals 162 are electrically connected to the conductive patterns 154 of the redistribution layer structure 150. The underfill 168 is dispensed aside the conductive terminals 162 to protect the electrical connection between the conductive terminals 162 of the memory 160 and the conductive patterns 154 of the redistribution layer structure 150 and securely adhere the memory 160 onto the redistribution layer structure 150.

Figure 4F:
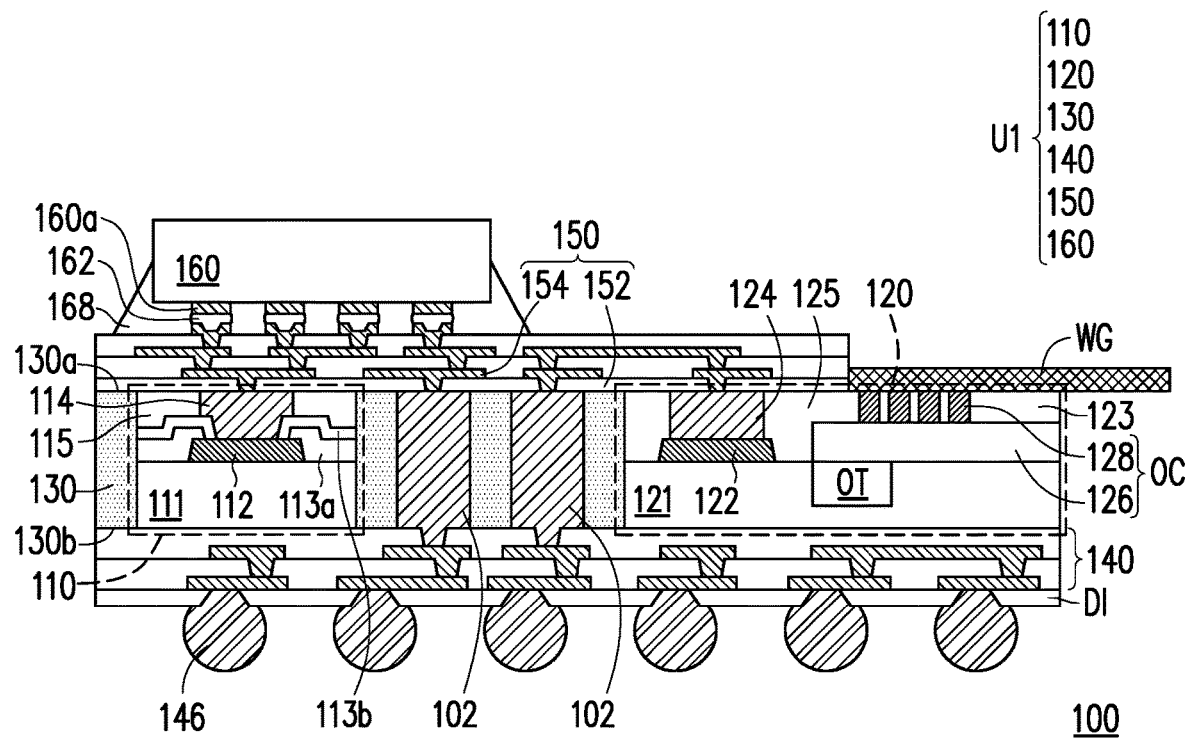
Figure 6:
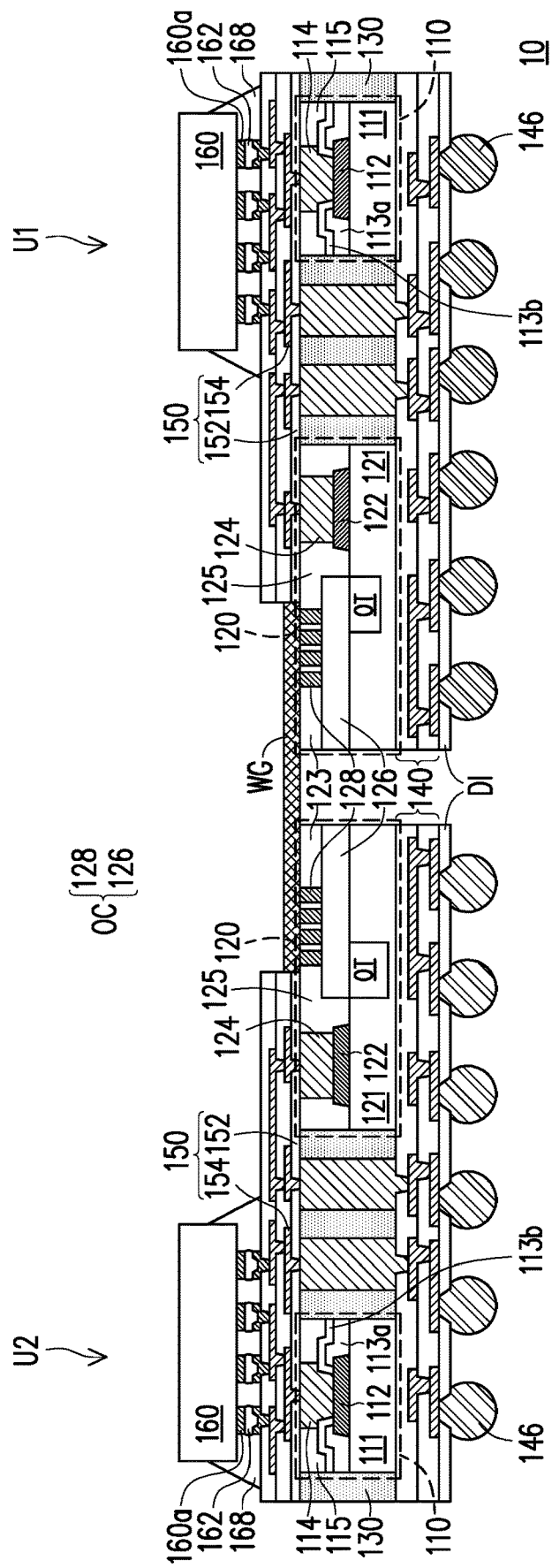
FIG. 6 is a schematic cross-sectional view of a semiconductor package in accordance with some embodiments.

Referring to FIG. 4F, the structure in FIG. 4E is de-bonded from the frame F2, and a semiconductor package 100 is formed. In some embodiments, the semiconductor package 100 includes a unit U1 and the waveguide WG optically coupled to the unit U1. In some embodiments, the unit U1 includes the electrical integrated circuit 110, the photonic integrated circuit 120 and the memory 160. In some embodiments, as shown in FIG. 6, the unit U1 of the FIG. 4F may be connected to another unit U2 by the waveguide WG therebetween, so as to form a semiconductor package 10. In some embodiments, the unit U2 has a configuration similar to the unit U1. However, the disclosure is not limited thereto. In some alternative embodiments, the units U1, U2 may have different configuration.

Figure 7:
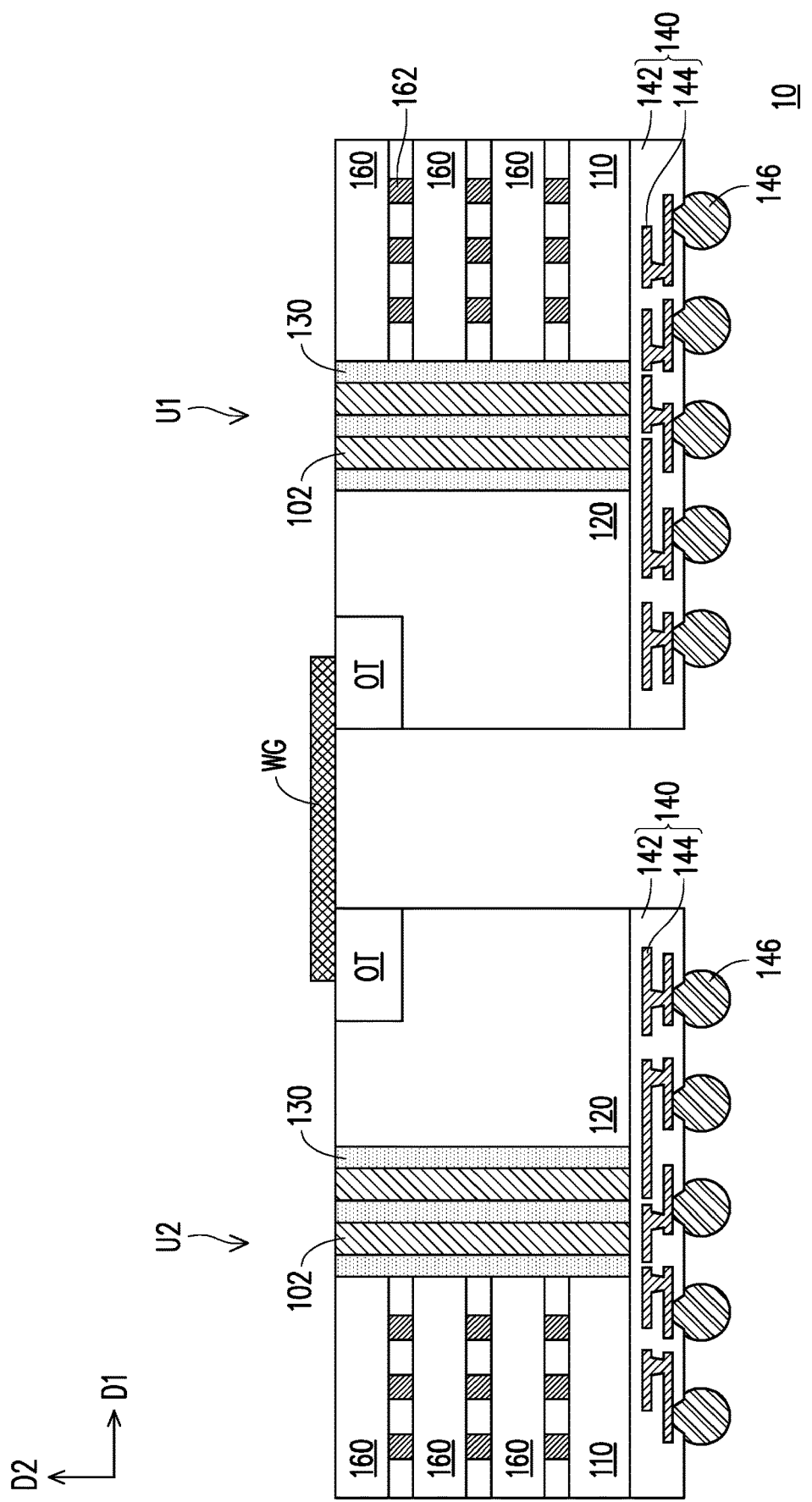
FIG. 7 is a schematic cross-sectional view of a semiconductor package in accordance with some embodiments.

FIG. 7 is a schematic cross-sectional view of a semiconductor package in accordance with some embodiments. The semiconductor package of FIG. 7 may be similar to the semiconductor package of FIG. 3, and thus the same reference numerals are used to refer to the same and liked parts, and its detailed description will be omitted herein. The difference is illustrated in details below.

Referring to FIG. 7, a semiconductor package 10 includes a plurality of units U1, U2 and a waveguide WG between the units U1, U2. In some embodiments, the unit U1, U2 includes a redistribution layer structure 140, an electrical integrated circuit 110, a photonic integrated circuit 120, a plurality of memories 160 and an encapsulant 130. In some embodiments, the electrical integrated circuit 110, the photonic integrated circuit 120 and the memories 160 are disposed on a first side of the redistribution layer structure 140 and encapsulated by the encapsulant 130. The electrical integrated circuit 110 and the photonic integrated circuit 120 are disposed side by side in a first direction D1 (e.g., horizontal direction). The memories 160 are stacked on the electrical integrated circuit 110 in a second direction D2 (e.g., vertical direction) substantially perpendicular to the first direction D1, for example. In some embodiments, the memories 160 and the electrical integrated circuit 110 are stacked vertically and electrically connected by conductive terminals 162 such as micro-bumps. In some embodiments, a plurality of conductive posts 102 are disposed between the photonic integrated circuit 120 and the electrical integrated circuit 110 and between the photonic integrated circuit 120 and the memory 160. The conductive posts 102 penetrate the encapsulant 130. In some embodiments, the redistribution layer structure 140 includes a plurality of dielectric layers 142 and a plurality of conductive patterns 144 in the dielectric layers 142. A plurality of conductive terminals 146 are disposed on a second side opposite to the first side of the redistribution layer structure 140 and electrically connected to the redistribution layer structure 140. By the redistribution layer structure 140, the electrical integrated circuit 110 and the photonic integrated circuit 120 are electrically connected. The configurations of the electrical integrated circuit 110 and the photonic integrated circuit 120 may be similar to or substantially the same as the configurations of the electrical integrated circuit 110 and the photonic integrated circuit 120 of FIG. 1E or FIG. 4F, and thus the details are omitted herein. However, the electrical integrated circuit 110 and the photonic integrated circuit 120 may have any other suitable configuration.

In some embodiments, the unit U1, U2 are disposed side by side and separated from each other. In some embodiments, the waveguide WG is optically coupled to optical transceivers OT of the photonic integrated circuits 120 respectively, so as to connect the units U1, U2. In some embodiments, the waveguide WG is disposed between and on the optical transceivers OT over the encapsulants 130, for example.

Figure 8:
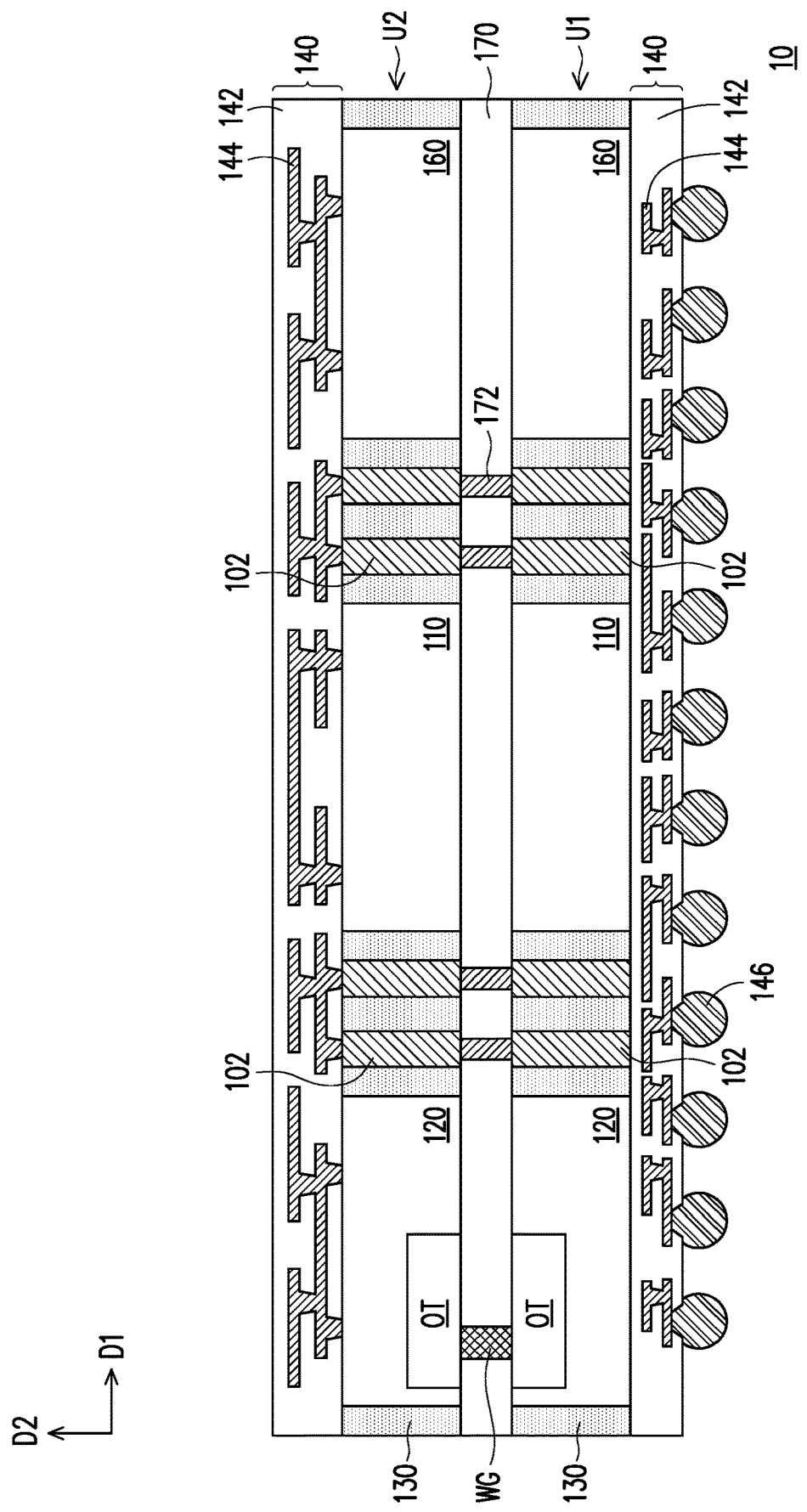
FIG. 8 is a schematic cross-sectional view of a semiconductor package in accordance with some embodiments.

FIG. 8 is a schematic cross-sectional view of a semiconductor package in accordance with some embodiments. The semiconductor package of FIG. 7 may be similar to the semiconductor package of FIG. 3, and thus the same reference numerals are used to refer to the same and liked parts, and its detailed description will be omitted herein. The difference is illustrated in details below.

Referring to FIG. 8, a semiconductor package 10 includes a plurality of units U1, U2 and a waveguide WG between the units U1, U2. In some embodiments, the unit U1, U2 includes a redistribution layer structure 140, an electrical integrated circuit 110, a photonic integrated circuit 120, a memory 160 and an encapsulant 130. In some embodiments, the electrical integrated circuit 110, the photonic integrated circuit 120 and the memory 160 are disposed side by side in a first direction D1 (e.g., horizontal direction) on the redistribution layer structure 140 and encapsulated by the encapsulant 130. In some alternative embodiments, the electrical integrated circuit 110 is disposed between the photonic integrated circuit 120 and the memory 160. However, the disclosure is not limited thereto. In some alternative embodiments, the photonic integrated circuit 120 is disposed between the electrical integrated circuit 110 and the memory 160, or the memory 160 is disposed between the electrical integrated circuit 110 and the photonic integrated circuit 120. In some embodiments, a plurality of conductive posts 102 are disposed between the photonic integrated circuit 120 and the electrical integrated circuit 110 and between the electrical integrated circuit 110 and the memory 160. The conductive posts 102 penetrate the encapsulant 130. The configurations of the electrical integrated circuit 110 and the photonic integrated circuit 120 may be similar to or substantially the same as the configurations of the electrical integrated circuit 110 and the photonic integrated circuit 120 of FIG. 1E or FIG. 4F, and thus the details are omitted herein. However, the electrical integrated circuit 110 and the photonic integrated circuit 120 may have any other suitable configuration.

In some embodiments, the units U1, U2 are bonded to each other in a face to face configuration. After bonding, the unit U2 is disposed on the unit U1 in a second direction D2 (e.g., vertical direction) substantially perpendicular to the first direction D1. In some embodiments, the electrical integrated circuits 110, the photonic integrated circuits 120 and the memories 160 are disposed between the redistribution layer structures 140. In some embodiments, the waveguide WG is disposed in a dielectric layer 170 on the unit U1, and the unit U2 is disposed on the waveguide WG and the dielectric layer 170. In some embodiments, the waveguide WG is optically coupled to optical transceivers OT of the units U1, U2 respectively, so as to connect the units U1, U2. In some embodiments, a plurality of conductive vias 172 are further formed in the dielectric layer 170 to electrically connect the conductive posts 102 of the units U1, U2. In some embodiments, a plurality of conductive terminals 146 are disposed under the redistribution layer structure 140 of the unit U1. However, the disclosure is not limited thereto.

Figure 9:
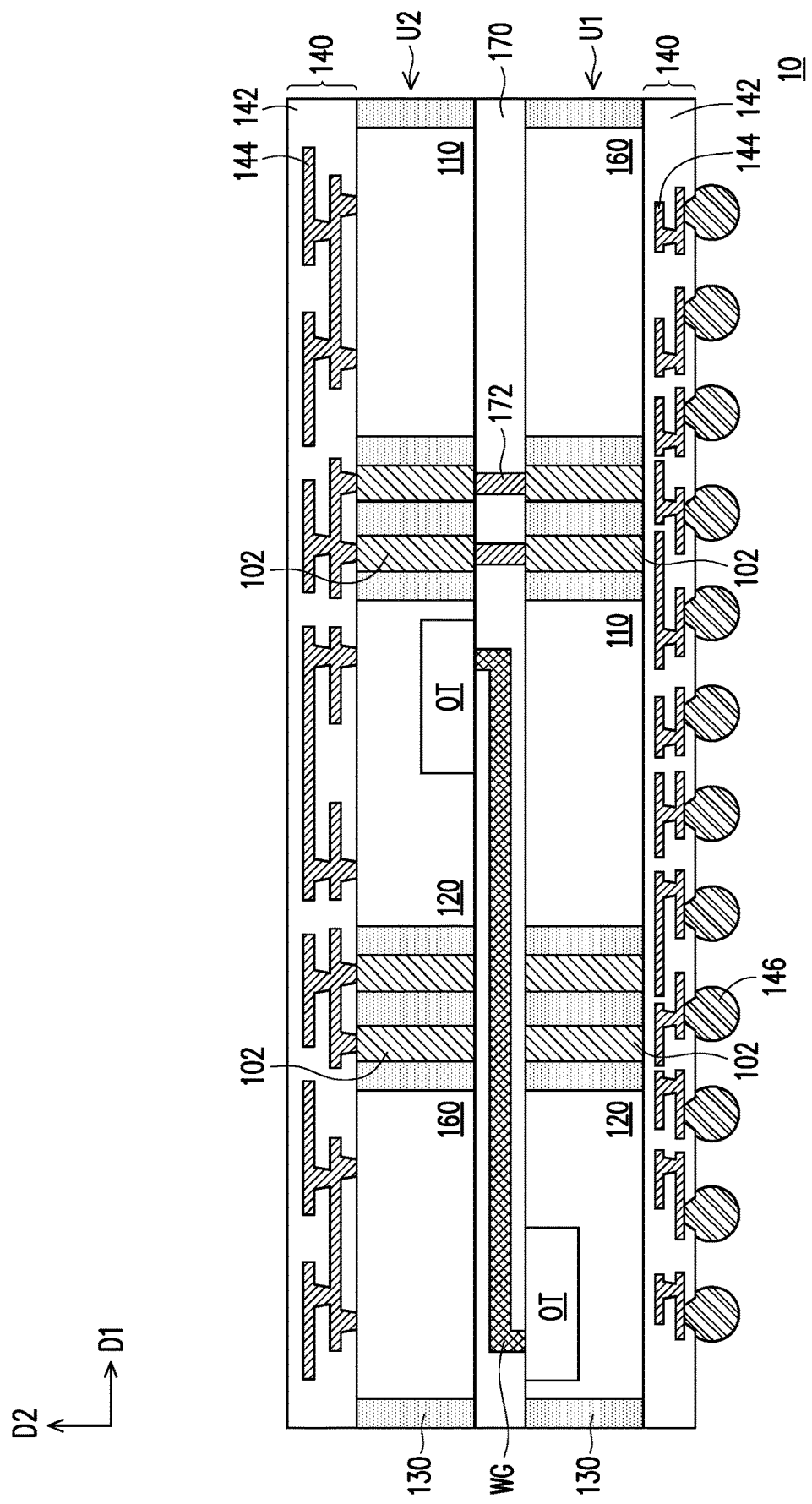
FIG. 9 is a schematic cross-sectional view of a semiconductor package in accordance with some embodiments.

In some embodiments, the optical transceiver OT of the unit U2 is partially overlapped with the optical transceiver OT of the unit U1 in the second direction D2. For example, the optical transceiver OT of the unit U2 is disposed directly on the optical transceiver OT of the unit U1. However, the disclosure is not limited thereto. In some alternative embodiments, as shown in FIG. 9, the optical transceiver OT of the unit U2 is not overlapped with the optical transceiver OT of the unit U1 in the second direction D2. For example, the photonic integrated circuit 120 of the unit U2 is disposed above the electrical integrated circuit 110 of the unit U1. The memory 160 of the unit U2 is disposed above the electrical integrated circuit 110 of the unit U1. The electrical integrated circuit 110 of the unit U2 is disposed above the memory 160 of the unit U1. In other words, the optical transceivers OT of the units U1, U2 are disposed offset from each other. In some embodiments, the waveguide WG is extended between the optical transceivers OT of the units U1, U2 in the first direction D1 (e.g., horizontal direction) substantially perpendicular to the second direction D2, to optically couple the optical transceivers OT respectively, so as to connect the units U1, U2.

Figure 10:
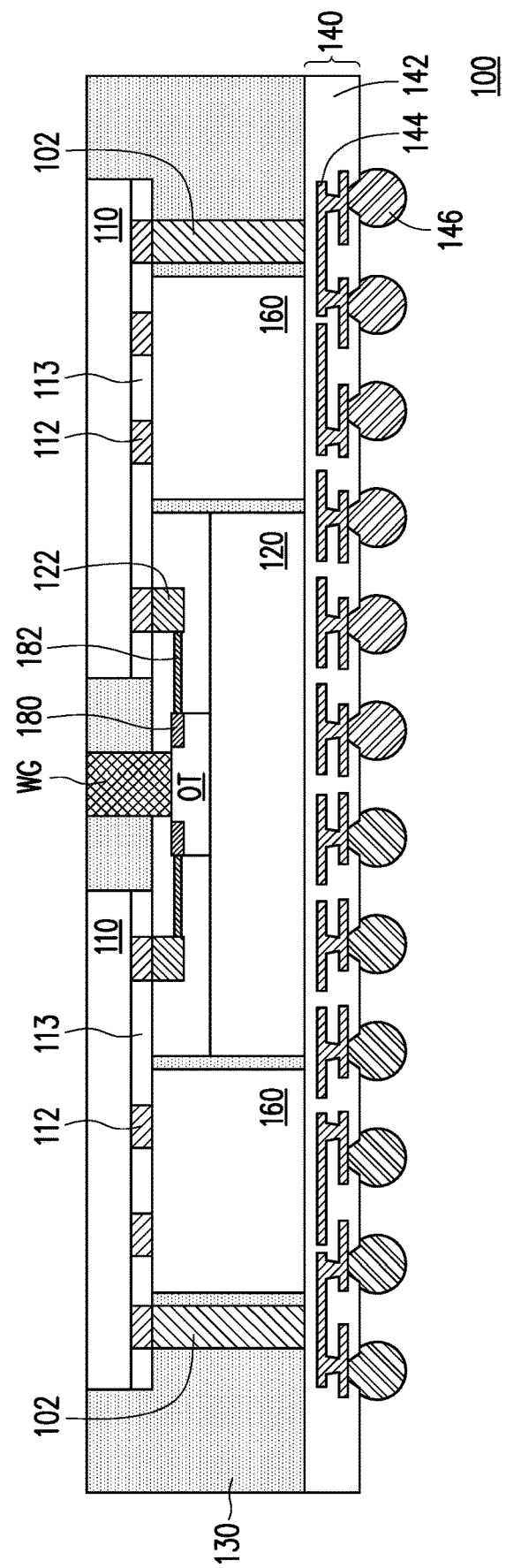
FIG. 10 is a schematic cross-sectional view of a semiconductor package in accordance with some embodiments.

FIG. 10 is a schematic cross-sectional view of a semiconductor package in accordance with some embodiments. The elements of the semiconductor package 100 of FIG. 10 may be similar to the elements of the semiconductor package 100 of FIG. 1E, and thus the same reference numerals are used to refer to the same and liked parts, and its detailed description will be omitted herein. The difference is illustrated in details below.

In some embodiments, the semiconductor package 100 includes a plurality of electrical integrated circuits 110, a plurality of memories 160, a photonic integrated circuit 120, a waveguide WG, a redistribution layer structure 140 and an encapsulant 130. In some embodiments, the memories 160 and the photonic integrated circuit 120 are disposed side by side, and the photonic integrated circuit 120 is disposed between the electrical integrated circuits 110. In some embodiments, the electrical integrated circuits 110 are disposed over and electrically connected to the memories 160, respectively. In some embodiments, the electrical integrated circuits 110 are electrically connected to an optical transceiver OT of the photonic integrated circuit 120. For example, conductive pads 112 of the electrical integrated circuits 110 are electrically connected to conductive pads 122 of the photonic integrated circuit 120, and the conductive pads 122 are electrically connected to conductive pads 180 of the optical transceiver OT by connective patterns 182. The waveguide WG is optically coupled to the optical transceiver OT. In some embodiments, the electrical integrated circuits 110, the photonic integrated circuit 120, the memories 160 and the waveguide WG are disposed over a first side of the redistribution layer structure 140 and encapsulated by the encapsulant 130. In some embodiments, a plurality of conductive posts 102 are disposed between and electrically connected to the electrical integrated circuit 110 and the redistribution layer structure 140. The conductive posts 102 penetrate the encapsulant 130. In some embodiments, a plurality of conductive terminals 146 are disposed on a second side opposite to the first side of the redistribution layer structure 140. In some embodiments, by the photonic integrated circuit 120, a plurality of the electrical integrated circuits 110 are connected. Furthermore, the semiconductor package 100 may be connected to another semiconductor package through the waveguide WG. The configurations of the electrical integrated circuit 110 and the photonic integrated circuit 120 may be similar to or substantially the same as the configurations of the electrical integrated circuit 110 and the photonic integrated circuit 120 of FIG. 1E or FIG. 4F, and thus the details are omitted herein. However, the electrical integrated circuit 110 and the photonic integrated circuit 120 may have any other suitable configuration.

Figure 11:
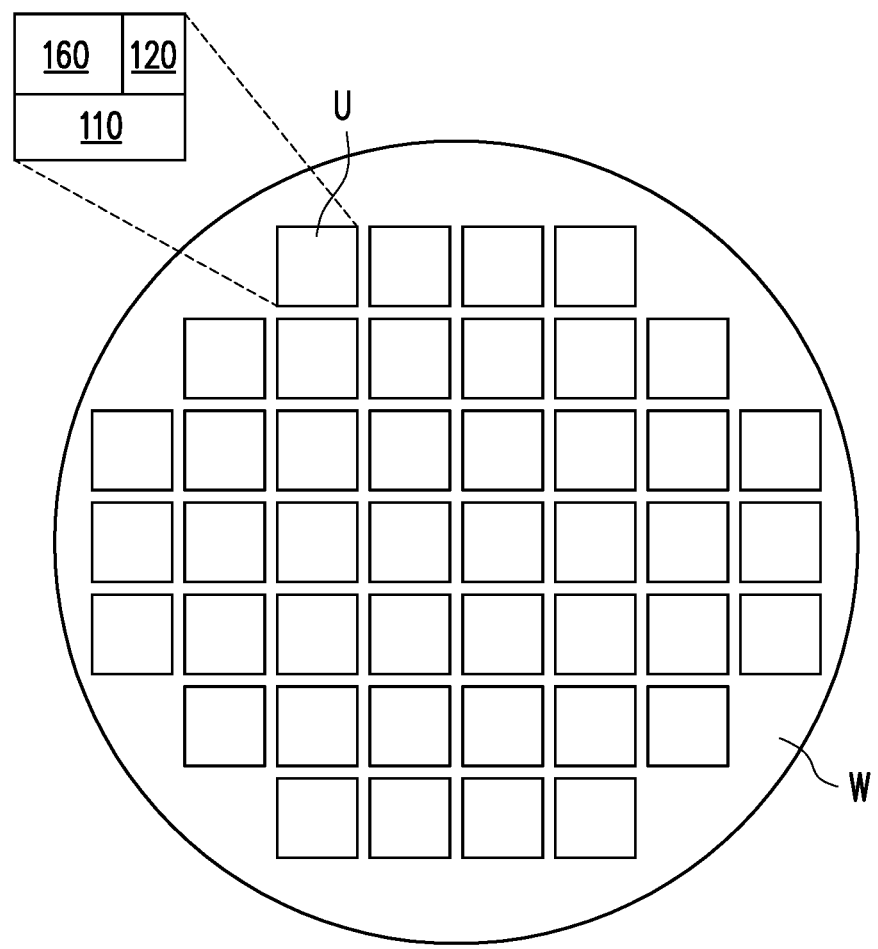
FIG. 11 is a schematic cross-sectional view of a semiconductor package in accordance with some embodiments.

In some embodiments, as shown in FIG. 11, a plurality of units U are arranged in an array on a wafer W, and the units U are connected to each other by a waveguide (not shown) therebetween. The wafer is a semiconductor wafer, a reconstituted wafer or any other suitable wafer for carrying the semiconductor package. The units U may include an electrical integrated circuit 110, a photonic integrated circuit 120 and a memory 160. In some embodiments, the unit U and the waveguide may be similar to the unit U1 and the waveguide WG of FIGS. 1E, 4F, 7, 8, 9 or 10. However, the disclosure is not limited thereto. In some alternative embodiments, the units U and the waveguide may have any other suitable configuration. Further, in some alternative embodiments, the units U may be horizontally arranged in an array, and further vertically stacked on one another. Accordingly, one system packaged on one wafer may be achieved.

In some embodiments, by using integrated fan-out (InFO) technique and the waveguide, optical interconnection between the photonic integrated circuit and the electrical integrated circuit are realized. Accordingly, ultra-speed signal transmission may be obtained, and the semiconductor package may be applied in multi-core high performance computing (HPC) applications. In addition, multiple dies such as the photonic integrated circuit, the electrical integrated circuit and the memory may be easily integrated without using an interposer. Conventionally, the interposer includes semiconductor materials such as silicon, and thus using the interposer increases the cost of manufacturing the semiconductor package. Accordingly, a form factor (or a thickness) of the semiconductor package and/or a cost for manufacturing the semiconductor package may become reduced.

According to some embodiments, a semiconductor package includes a first redistribution layer structure, a photonic integrated circuit, an electronic integrated circuit, a waveguide and a memory. The photonic integrated circuit is disposed over and electrically connected to the first redistribution layer structure, and includes an optical transceiver and an optical coupler. The electronic integrated circuit is disposed over and electrically connected to the first redistribution layer structure. The waveguide is optically coupled to the optical coupler. The memory is electrically connected to the electronic integrated circuit.

According to some embodiments, a semiconductor package includes a first unit, a second unit and a waveguide. The first unit includes a first photonic integrated circuit, a first electronic integrated circuit and a first memory electrically connected to each other, and the first photonic integrated circuit includes a first optical transceiver. The second unit includes a second photonic integrated circuit, a second electronic integrated circuit and a second memory electrically connected to each other, and the second photonic integrated circuit includes a second optical transceiver. The waveguide is disposed between and optically coupled to the first optical transceiver and the second optical transceiver.

According to some embodiments, a semiconductor package includes a redistribution layer structure, a plurality of memories, a photonic integrated circuit, a plurality of electronic integrated circuits and a waveguide. The memories are disposed over and electrically connected to the redistribution layer structure. The photonic integrated circuit includes an optical transceiver and is disposed between the memory devices over the redistribution layer structure. The electronic integrated circuits are respectively disposed over and electrically connected to the memories and the photonic integrated circuit. The waveguide is disposed between the electronic integrated circuits and optically coupled to the optical transceiver.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a first redistribution layer structure;
   a photonic integrated circuit, disposed over and electrically connected to the first redistribution layer structure, comprising an optical transceiver and an optical coupler;
   an electronic integrated circuit, disposed over and electrically connected to the first redistribution layer structure;
   a waveguide, optically coupled to the optical coupler, wherein the waveguide is disposed at an edge of the photonic integrated circuit and protruding from the edge of the photonic integrated circuit; and
   a memory, electrically connected to the electronic integrated circuit.

2. The semiconductor package as claimed in claim 1, wherein the optical coupler is disposed between the optical transceiver and the waveguide.

3. The semiconductor package as claimed in claim 1, further comprising a second redistribution layer structure disposed between and electrically connected to the electronic integrated circuit and the memory.

4. The semiconductor package as claimed in claim 1, further comprising an encapsulant encapsulating the photonic integrated circuit and the electronic integrated circuit.

5. The semiconductor package as claimed in claim 1, wherein the optical coupler comprises a silicon waveguide and a polymer waveguide between the silicon waveguide and the waveguide.

6. The semiconductor package as claimed in claim 1, wherein the optical coupler comprises a silicon waveguide and a grating between the silicon waveguide and the waveguide.

7. The semiconductor package as claimed in claim 1, wherein the waveguide includes an optical fiber.

8. A semiconductor package, comprising:
   a first unit, comprising a first photonic integrated circuit, a first electronic integrated circuit and a first memory electrically connected to each other, the first photonic integrated circuit comprising a first optical transceiver;
   a second unit, comprising a second photonic integrated circuit, a second electronic integrated circuit and a second memory electrically connected to each other, the second photonic integrated circuit comprising a second optical transceiver; and
   a waveguide, disposed between and optically coupled to the first optical transceiver and the second optical transceiver.

9. The semiconductor package as claimed in claim 8, wherein the first photonic integrated circuit and the first electronic integrated circuit are disposed side by side in a first direction, and the first memory is stacked on the first electronic integrated circuit in a second direction substantially perpendicular to the first direction.

10. The semiconductor package as claimed in claim 8, wherein the first unit and the second unit are disposed side by side in a first direction, and the waveguide is stacked on the first unit and the second unit in a second direction substantially perpendicular to the first direction.

11. The semiconductor package as claimed in claim 8, wherein the first unit further comprises a first encapsulant encapsulating the first photonic integrated circuit, the first electronic integrated circuit and the first memory, the second unit further comprises a second encapsulant encapsulating the second photonic integrated circuit, the second electronic integrated circuit and the second memory, and the waveguide is disposed over the first encapsulant and the second encapsulant.

12. The semiconductor package as claimed in claim 8, wherein the second photonic integrated circuit is partially overlapped with the first photonic integrated circuit.

13. The semiconductor package as claimed in claim 8, wherein the waveguide is extended in a first direction between the first optical transceiver and the second optical transceiver, and the first optical transceiver and the second optical transceiver are not overlapped in a second direction substantially perpendicular to the first direction.

14. The semiconductor package as claimed in claim 8, further comprising a first redistribution layer structure electrically connected to the first unit and a second redistribution layer structure electrically connected to the second unit, wherein the first unit and the second unit are disposed between the first redistribution layer structure and the second redistribution layer structure.

15. The semiconductor package as claimed in claim 8, wherein the first photonic integrated circuit, the first electronic integrated circuit and the first memory of the first unit are disposed side by side in a first direction, and the second unit is disposed on the first unit in a second direction substantially perpendicular to the first direction.

16. A semiconductor package, comprising:
 a redistribution layer structure;
 a plurality of memories, disposed over and electrically connected to the redistribution layer structure;
 a photonic integrated circuit comprising an optical transceiver, disposed between the memory devices over the redistribution layer structure;
 a plurality of electronic integrated circuits, respectively disposed over and electrically connected to the memories and the photonic integrated circuit; and
 a waveguide, disposed between the electronic integrated circuits and optically coupled to the optical transceiver.

17. The semiconductor package as claimed in claim 16, wherein the optical transceiver is electrically connected to the electronic integrated circuits.

18. The semiconductor package as claimed in claim 16, further comprising an encapsulant encapsulating the electronic integrated circuits, the memory devices, the shared photonic integrated circuit and the waveguide.

19. The semiconductor package as claimed ill claim 16, further comprising a plurality of conductive posts to electrically connect the electronic integrated circuits and the redistribution layer structure.

20. The semiconductor package as claimed in claim 1, wherein the electronic integrated circuit is disposed between the first redistribution layer structure and the memory.

* * * * *